June 28, 1966 TOKUZO SUKEGAWA ET AL 3,258,371
SILICON SEMICONDUCTOR DEVICE FOR HIGH FREQUENCY, AND METHOD OF ITS MANUFACTURE
Filed Jan. 29, 1963
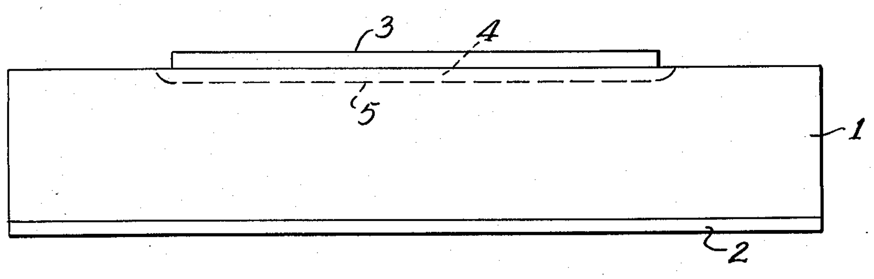

United States Patent Office 3,258,371

Patented June 28, 1966

3,258,371

SILICON SEMICONDUCTOR DEVICE FOR HIGH FREQUENCY, AND METHOD OF ITS MANUFACTURE

Tokuzo Sukegawa and Jun-Ichi Nishizawa, Sendai-shi, Japan, assignors to Semiconductor Research Foundation, Miyazi-ken, Japan, a corporation of Japan Filed Jan. 29, 1963, Ser. No. 254,784
Claims priority, application Japan, Feb. 1, 1962, 37/3,602
5 Claims. (Cl. 148—33)

Our invention relates to diodes, transistors and other electronic semiconductor devices having a crystalline body of silicon with one or more p-n junctions.

For high-frequency use of such devices it is desirable that the density or concentration of the dopant atoms be greatest at the p-n junction and decrease gradually with increasing distance therefrom. In practice, however, drift transistors, drift diodes, voltage-responsively variable capacitor diodes and various other semiconductor junction devices have heretofore not been reliably reproducible in this manner by large-scale manufacture. It is also necessary to provide for qualitative uniformity from product to product as regards dopant distribution in the junction regions, and to afford sufficiently controlling the manufacturing procedure by changing the duration and temperature of the heat treatment for obtaining prescribed qualitative data of the electric properties.

The processes heretofore used in the manufacture of silicon semiconductor devices for obtaining the above-mentioned distribution of dopant impurities in the silicon crystal involve applying an alloying method after preceding diffusion treatment. The results leave much to be desired as regards uniformity of alloy distribution, so that the electric characteristics obtained fail to satisfactorily approach theoretically attainable values.

It is an object of our invention, to improve diodes, transistors and other p-n junction silicon devices, particularly for high-frequency use, as regards one or more of such electrical-properties as gain, band width, and response of capacitance to changes in applied voltage. In this respect, it is another, more specific object to provide an improved silicon diode of variable capacitance for parametron amplification and frequency-modulation purposes and so on.

According to our invention, we produce a p-n junction in a silicon crystal as follows. Basically we apply the process of alloying a donor-doped electrode or contact of tin or gold with a p-type silicon body or a p-type silicon region so that donor impurity will become alloyed with the silicon and form a donor-doped region of n-type conductance with a p-n junction at the p-type region. According to our invention, however, we apply diffusion simultaneously with the alloying process by admixing a small amount of aluminum, in addition to at least one of the donor impurities antimony, arsenic and phosphorus, to the metallic material which, as mentioned, is predominantly made of tin or gold or both of them.

The accompanying drawing shows schematically and by way of example an embodiment of a diode thus made according to the invention.

A circular disc 1 of monocrystalline p-type silicon is alloyed together with an ohmic contact electrode 2 of gold or aluminum and carries on the opposite side an alloyed electrode 3 produced from a metal foil of tin of gold or both of them which contains, as donor impurity, one or more of antimony, arsenic and phosphorus, but which also contains aluminum in an amount smaller than that of the donor impurity. Due to the alloying and conjoint diffusion process, donor impurity and aluminum atoms have migrated into an n-region 4 of the silicon body 1, thus forming a p-n junction 5.

In general, the amount of aluminum admixed to the donor-doped electrode metal is less than 30% down to 0.01% or less in atom percent of the entire composition having a donor content of 0.01 to 30% of one or more of Sb, As, P; the remainder may contain Sn, Au or both in an amount of less than 40 atom percent of the whole, and may also contain silicon in an amount of up to 15%.

Aluminum is an acceptor in silicon and has a larger distribution coefficient in silicon than the above-mentioned donor impurities. For both reasons, the admixture of aluminum to the donor-doped electrode metal seems adverse to the intended purpose of forming a p-n junction. However, we apply aluminum in a small quantity, for example in the atomic proportion of 1 to 10 relative to the donor impurity, the quantity of the latter being chosen in the known manner in accordance with the desired dopant concentration in the n-type region. For example, suitable compositions of the donor-doped electrode material contain 0.1 to 5 atom percent aluminum, 1 to 35 atom percent of donor impurities (Sb, As, P), the remainder being tin or gold or both of them.

The improved properties obtained by virtue of the invention can be explained as follows. During the alloying process mentioned above, the high diffusion coefficient of aluminum causes it to diffuse into the silicon as though aluminum were being diffused individually. Thus, the penetration of aluminum into the silicon precedes the advance of the alloying front proper and produces or enhances a p-type diffusion region. Simultaneously, the advancing production of an alloy with at least one of antimony, arsenic or phosphorus finally results in converting the region into an alloyed layer of n-type.

As a result, the aluminum distribution is such that the dopant concentration is greatest at the junction area and gradually decreases according to the distance from the junction. Conjointly, because the migration by diffusion started from the alloying surface or front, an equal distribution over the entire extent of the front, that is in a direction parallel thereto, is obtained, which also contributes to the beneficial results obtained. The fact that the contact metal contains a relatively large quantity of in or gold or both of them makes it possible to immediately attach a wire or other conductor to the metal after cooling, an advantage not obtainable if the electrode material, aside from the very slight aluminum addition, consists entirely of the above-mentioned donor dopants which, if used in the extremely high purity required for electronic semiconductor purposes, do not readily lend themselves to attachment of other conductors.

The advantages achieved by virtue of the invention will be understood from the following.

A semiconductor variable capacitor, consisting of a diode whose capacitance can be varied by applying variable voltage, for such purposes as parametron amplification, automatic frequency correction, or frequency modulation, depends for its gain and band width upon the largest feasible value of the term $dC/dV/C$ in which C denotes capacitance and V denotes voltage. The value of this term in the variable-capacitor diodes heretofore available was limited to a range of about $-(2V)^{-1}$ to $-(3V)^{-1}$ because the capacitance-voltage proportionality was in the range of $C\alpha V^{-1/2}$ to $C\alpha V^{-1/3}$.

By comparison, a semiconductor variable capacitor made according to the invention permits obtaining several times up to several ten times the above mentioned $dC/dV/C$ value. This can be explained by the fact that the distribution of dopant atoms in the semiconductor crystal has been made less gradual in the direction from the p-n junction to the electrode.

For example, silicon diodes were made in the manner described above by using an electrode composed of aluminum, antimony and tin in the atomic proportion of 1:10:460. A circular electrode foil of 0.1 mm. thickness and 1 mm. diameter was placed upon the silicon crystal of somewhat less than 0.5 mm. thickness and 0.7 to 2.00 diameter. Both were heated, under application of sufficient pressure, for maintaining contact engagement, at a temperature of 1000° C. for 50 minutes. The semiconductor member was then permitted to cool. The junction capacitance of the diode was measured at different voltages. At 3 volts, the capacitance was found to be about one-tenth of the value measured at 0 volt. The peak inverse voltage was approximately 20 volts.

Substantially the same result with respect to the considerable change in voltage-responsive capacitance was measured with a silicon diode prepared with an electrode of aluminum, antimony and tin in the atomic proportion 1:10:20. The heat treatment at 1000° C., required for diffusion and alloying, was performed for only five minutes. In this case the peak inverse voltage was approximately 3 volts.

Corresponding results were obtained with electrodes that contained gold instead of tin. The use of gold affords increasing the values of characteristic impedance and working voltage so that the device becomes applicable for higher power requirements.

Our invention, of course, is not limited to the particular device illustrated herein and described above but is applicable to a variety of p-n junction devices with one or several junction, as well as for various other uses in which either the improvement in gain, band width r variable capacitance is utilized.

In principle, our invention is also applicable to germanium semiconductor devices. In the case of silicon devices, however, the alloy formation is more uniform and the device becomes applicable for manufacture and use at high temperatures.

We claim:

1. An electronic semiconductor device for high frequency comprising a crystalline body of silicon having two mutually adjacent regions of p-type and n-type conductance forming a p-n junction in said body, said n-type region having joined therewith an electrode formed from metal of the group consisting of tin, gold and mixtures thereof with donor impurity from the group consisting of at least one of antimony, phosphorus and arsenic therein and with aluminum therein, the aluminum being in a quantity smaller than that of said donor impurity, and said n-type region containing donor impurity and aluminum from the electrode in diffused distribution and having a dopant concentration decreasing with increasing distance from said junction.

2. The method of producing an electronic semiconductor device having a crystalline body of silicon with three regions of p-type and n-type conductance forming two p-n junctions in said body, which comprises the steps of joining with an in-type region of the silicon body a metal electrode from the group consisting of tin, gold and mixtures thereof with donor impurity from the group consisting of antimony, phosphorus and arsenic and mixtures thereof said electrode also containing aluminum in a quantity smaller than that of the donor impurity, and alloying the electrode together with the silicon body to produce in the body a p-type and n-type regions forming two p-n junctions.

3. The method of producing an electronic device having a crystalline silicon body with two p-n junctions, which comprises alloying a tin electrode with 1 to 35 atom percent donor impurity from the group consisting of at least one of antimony, phosphorus and arsenic and with 0.1 to 5 atom percent aluminum, the quantity of aluminum being less than the quantity of donor impurity, to an n-type region of a silicon body to simultaneously form two p-n junctions.

4. The method of producing an electronic device having a crystalline silicon body with two p-n junctions, which comprises alloying a tin and gold electrode with 1 to 35 atom percent donor impurity from the group consisting of at least one of antimony, phosphorus and arsenic and with 0.1 to 5 atom percent aluminum, the quantity of aluminum being less than the quantity of donor impurity, to an n-type region of a silicon body to simultaneously form two p-n junctions.

5. The method of producing an electronic semiconductor device having a crystalline body of silicon with two regions of p-type and n-type conductance forming a p-n junction in said body, which comprises the steps of joining with a p-type region of the silicon body an electrode member of a metallic composition with 0.1 to 5 atom percent aluminum, 1 to 35 atom percent of donor impurity selected from the group consisting of antimony, phosphorus and arsenic, the remainder consisting of metal from the group consisting of at least one of tin and gold, the atomic proportion of aluminum to remainder impurity being about 1:10, and the atomic proportion of said remainder being a multiple of that said donor impurity and constituting the preponderant share of said composition, alloying the metallic composition with the silicon body to produce in the body a p-type region forming a p-n junction and having a dopant concentration decreasing with increasing distance from the junction.

References Cited by the Examiner

UNITED STATES PATENTS

| | | | |
|---|---|---|---|
| 2,836,521 | 5/1958 | Longini | 148—178 |
| 2,943,006 | 6/1960 | Henkels | 148—185 |
| 3,010,857 | 11/1960 | Nelson | 148—185 |
| 3,074,826 | 1/1963 | Tummers | 148—181 |
| 3,078,397 | 2/1963 | Tummers et al. | 148—185 |

DAVID L. RECK, *Primary Examiner.*

HYLAND BIZOT, *Examiner.*

R. O. DEAN, *Assistant Examiner.*